United States Patent [19]

Noel et al.

[11] Patent Number: 4,712,721
[45] Date of Patent: Dec. 15, 1987

[54] SOLDER DELIVERY SYSTEMS

[75] Inventors: Raymond Noel, Menlo Park; William M. Robinson, Palo Alto; Gabe Cherian, Fremont; Thomas H. Clifford, Half Moon Bay; William D. Carlomagno; William M. Deasy, both of Redwood City, all of Calif.; Willie K. Grassauer, Mapleton, Oreg.; David K. Haygood, Sunnyvale, Calif.; H. Paul Sherlock, San Francisco, Calif.; Harry E. White, Newark, Calif.

[73] Assignee: Raychem Corp., Menlo Park, Calif.

[21] Appl. No.: 840,624

[22] Filed: Mar. 17, 1986

[51] Int. Cl.⁴ .................. H01L 21/58; B23K 1/12
[52] U.S. Cl. .................. 228/56.3; 228/180.2; 228/225; 228/245; 439/83
[58] Field of Search .................. 228/180.2, 225, 245, 228/14, 41, 255, 165, 56.3; 339/275 R, 275 B, 275 C, 17 CF; 206/345, 341, 347

[56] References Cited

U.S. PATENT DOCUMENTS

| | | |
|---|---|---|
| 3,320,658 | 5/1967 | Bolda et al. . |
| 3,396,894 | 5/1965 | Ellis . |
| 3,472,365 | 10/1969 | Tiedema . |
| 3,516,155 | 6/1970 | Smith .................. 228/56.3 X |
| 3,719,981 | 3/1973 | Steitz .................. 228/180.1 X |
| 3,744,129 | 7/1973 | Dewey, Jr. . |
| 3,795,884 | 3/1974 | Kotaka . |
| 3,926,360 | 12/1975 | Moister, Jr. . |
| 3,982,320 | 9/1976 | Buchoff et al. . |
| 3,991,463 | 11/1976 | Squitieri et al. . |
| 3,998,512 | 12/1976 | Anhalt et al. .................. 339/17 CF |
| 4,027,936 | 6/1977 | Nemoto et al. . |
| 4,064,623 | 12/1977 | Moore . |
| 4,067,104 | 1/1978 | Tracy .................. 29/626 |
| 4,089,575 | 5/1978 | Grabbe . |
| 4,144,648 | 3/1979 | Grovender . |
| 4,195,193 | 3/1980 | Grabbe et al. .................. 174/52 FP |
| 4,209,893 | 7/1980 | Dyce et al. . |
| 4,216,350 | 8/1980 | Reid . |
| 4,295,700 | 10/1981 | Sado . |
| 4,334,727 | 6/1982 | Scheingold et al. . |
| 4,354,629 | 10/1982 | Grassauer et al. .................. 228/56.3 X |
| 4,390,220 | 6/1983 | Benasutti . |
| 4,402,450 | 9/1983 | Abraham et al. . |
| 4,412,642 | 11/1983 | Fisher, Jr. . |
| 4,445,736 | 5/1984 | Hopkins .................. 339/17 CF |
| 4,458,968 | 7/1984 | Madden .................. 339/17 CF |
| 4,556,276 | 12/1985 | Curtis, III .................. 339/275 B X |

FOREIGN PATENT DOCUMENTS 2117686 10/1983 United Kingdom .
2142568 1/1985 United Kingdom .

OTHER PUBLICATIONS

IBM Technical Disclosure Bulletin, vol. 21, No. 6, Nov. 1978, pp. 2322-2324, Druschel et al.

Primary Examiner—Nicholas P. Godici
Assistant Examiner—Carmine Cuda
Attorney, Agent, or Firm—T. Gene Dillahunty

[57] ABSTRACT

Mechanical means and methods for delivery of solder preforms arranged in generally rectilinear patterns and oriented so that the ends of the solder preforms may join two planar surfaces upon the application of heat are disclosed. Several embodiments facilitate the delivery of solder preforms in the forms of posts, clips and rings.

24 Claims, 41 Drawing Figures

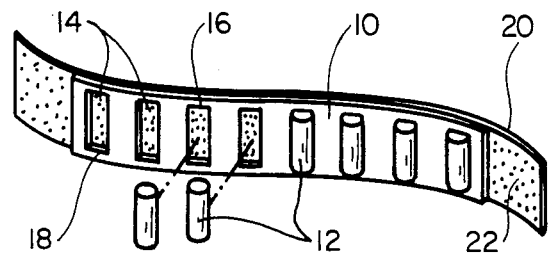
FIG_1
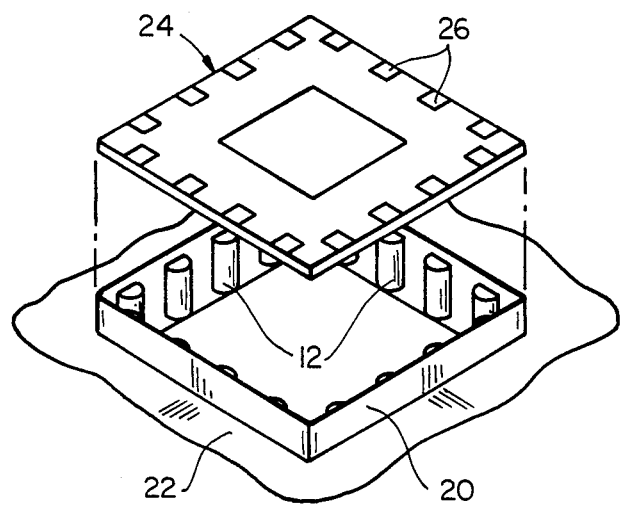
FIG_2
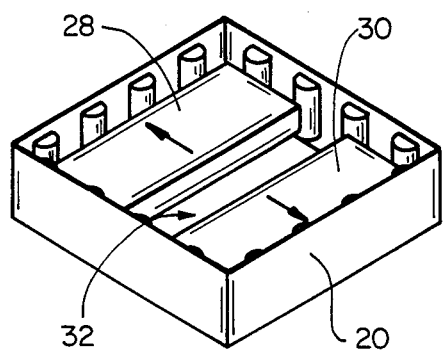
FIG_3

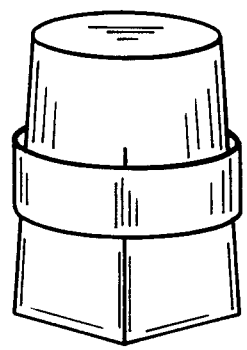
FIG_4
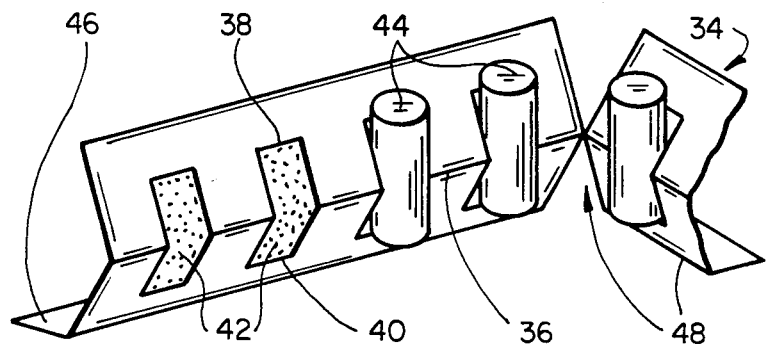
FIG_5
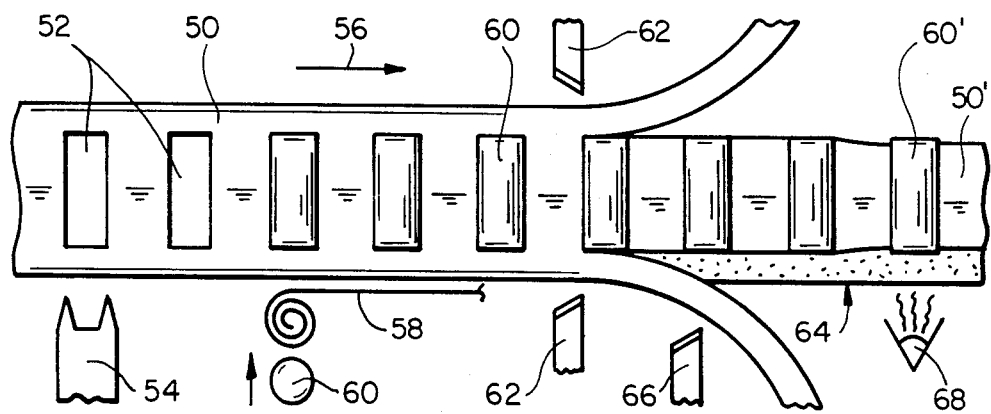
FIG_6

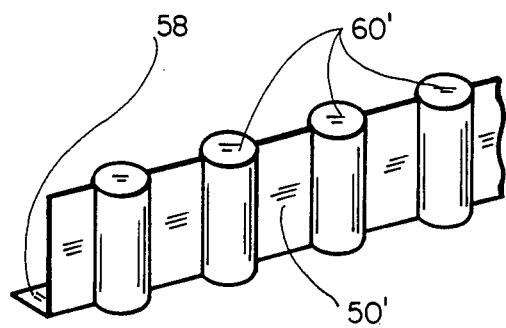
FIG_7
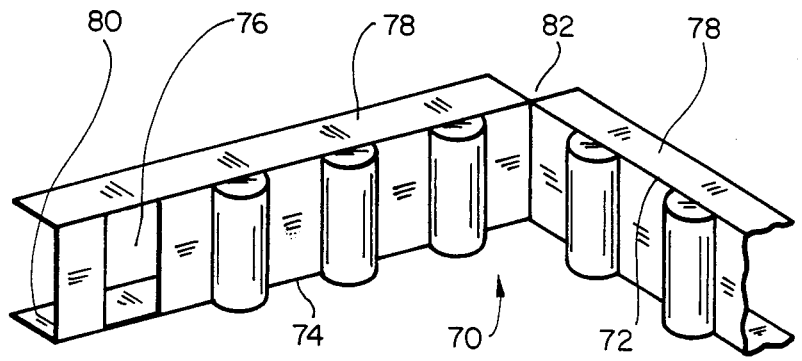
FIG_8
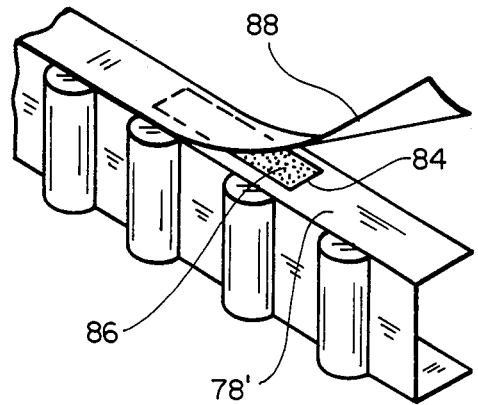
FIG_9

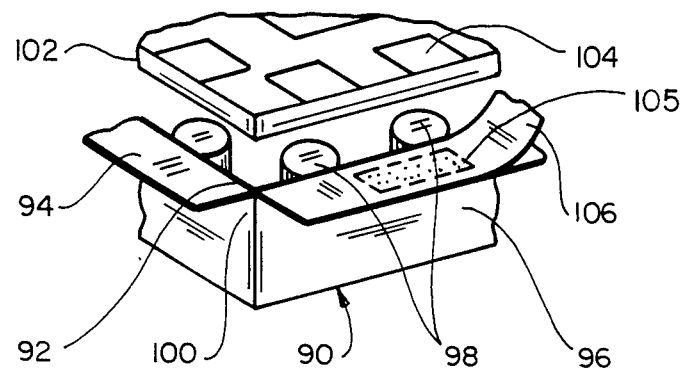
FIG_10
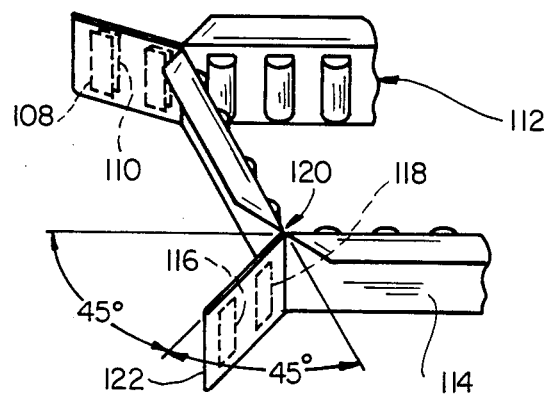
FIG_11
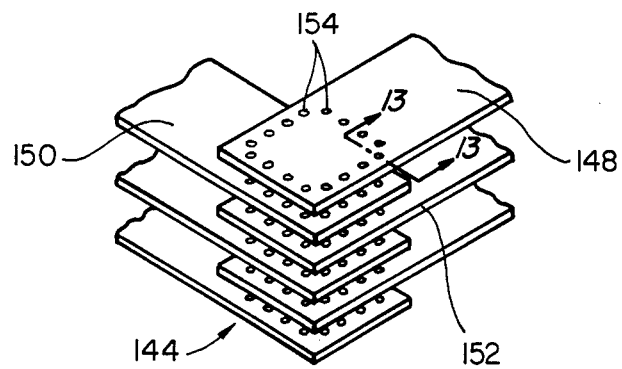
FIG_12

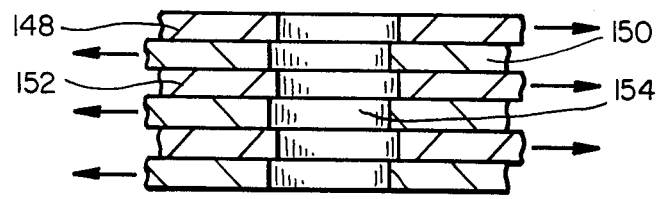
FIG_13
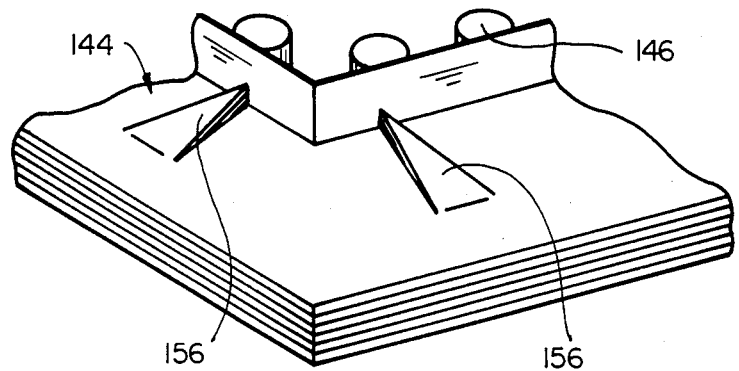
FIG_14
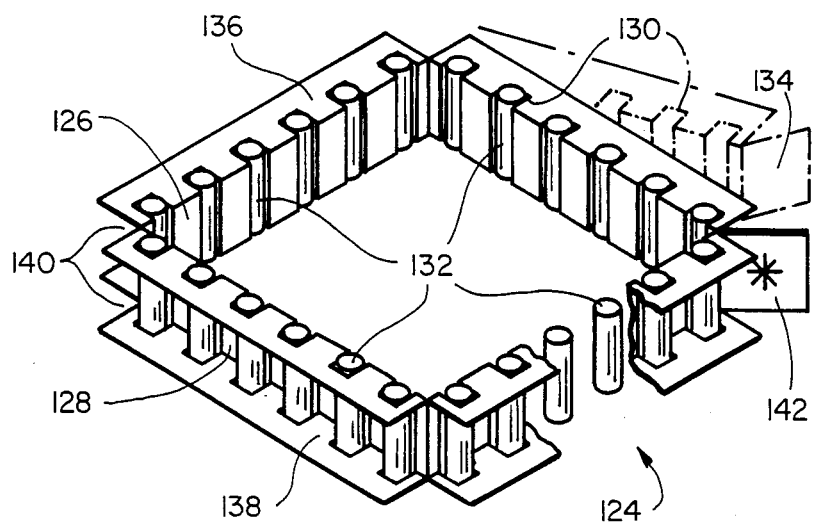
FIG_15

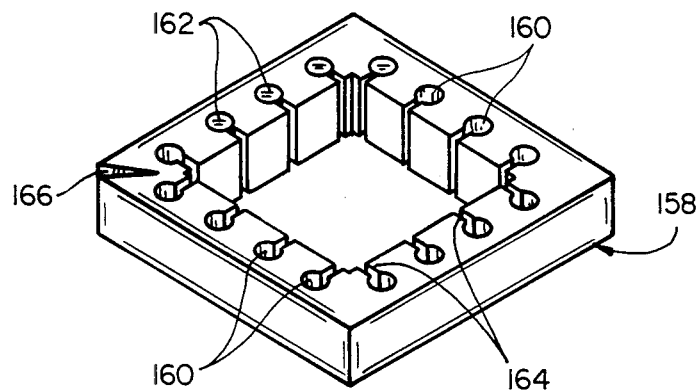
FIG_16
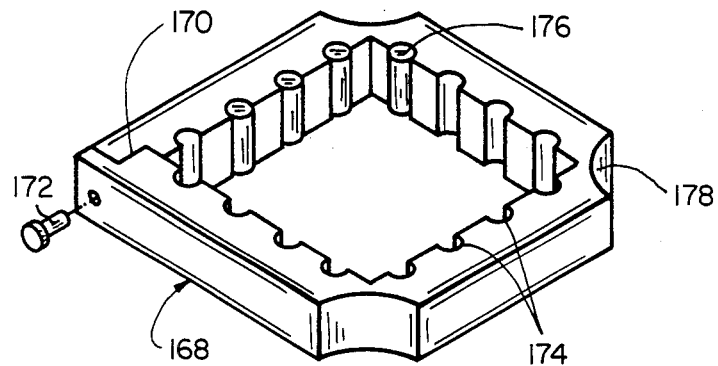
FIG_17
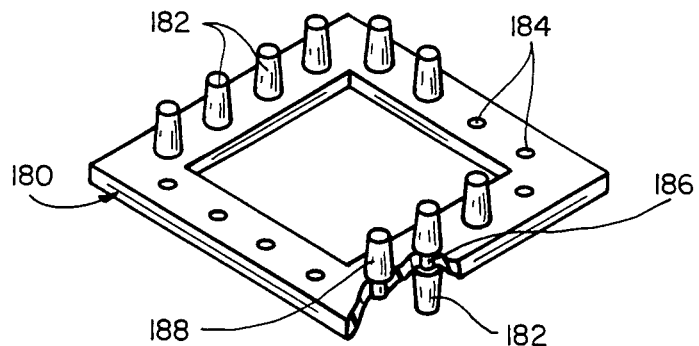
FIG_18

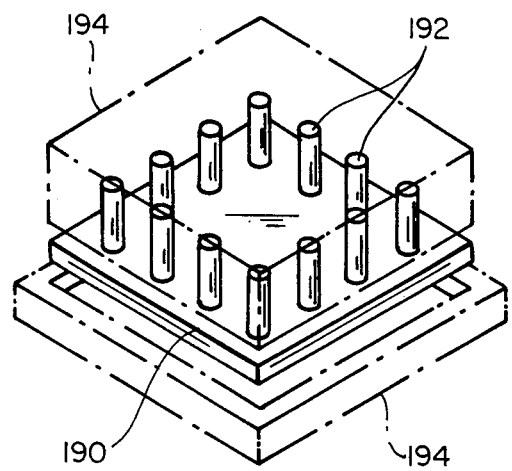
FIG_19
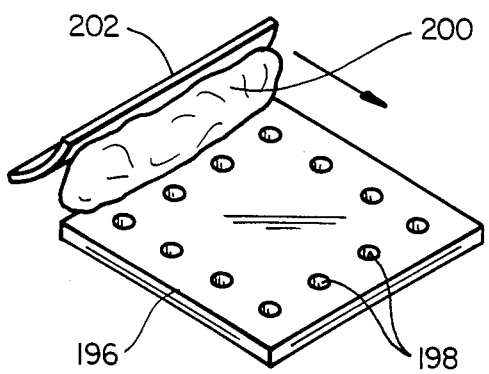
FIG_20
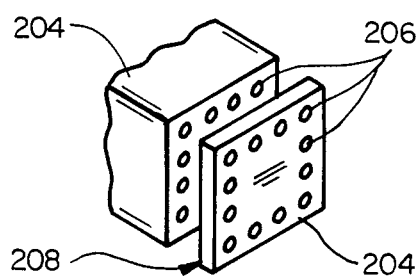
FIG_21

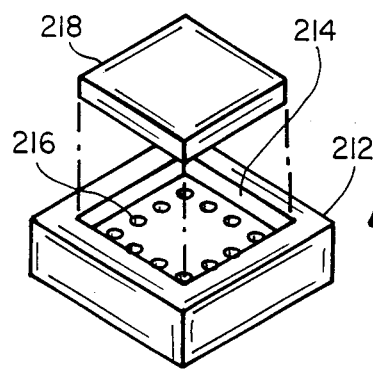
FIG_22A
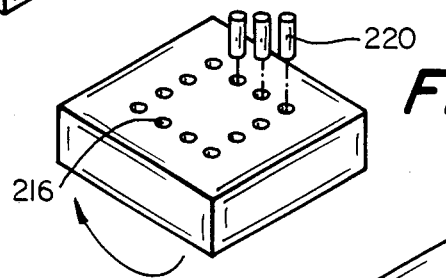
FIG_22B
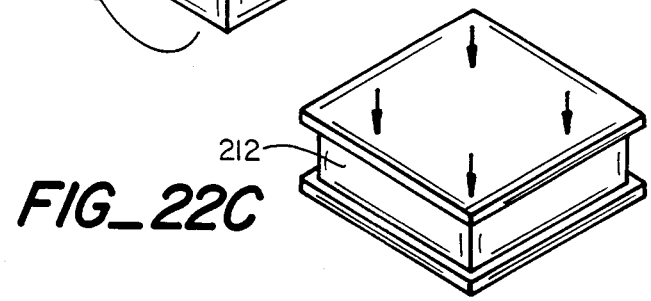
FIG_22C
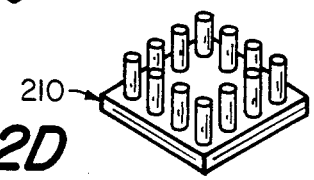
FIG_22D
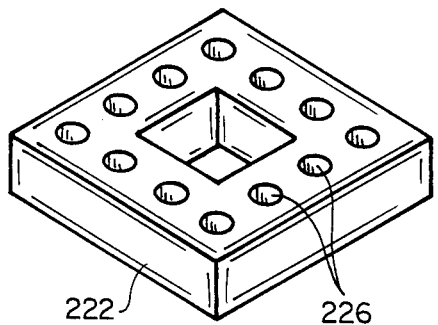
FIG_23
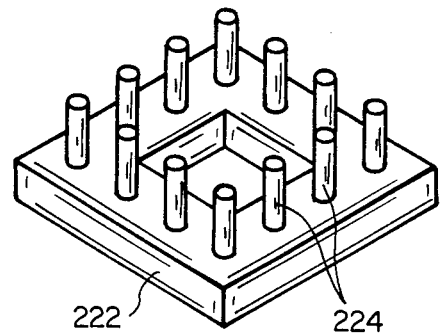
FIG_24

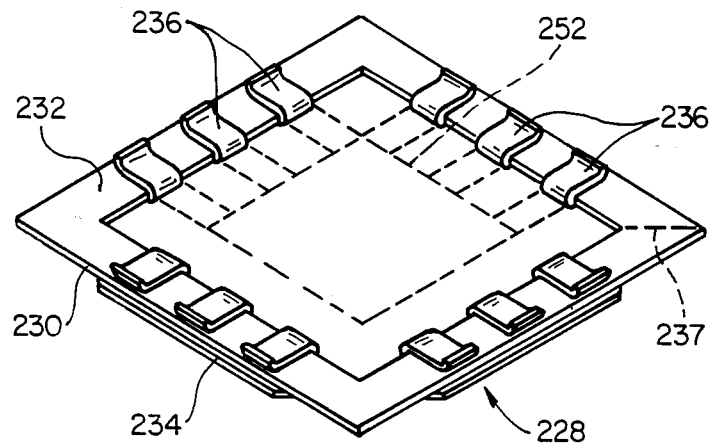
FIG_25
FIG_26
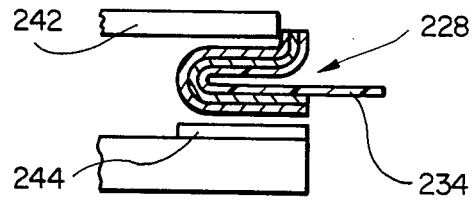
FIG_27
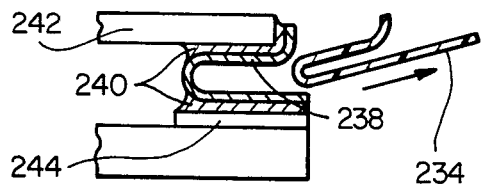
FIG_28

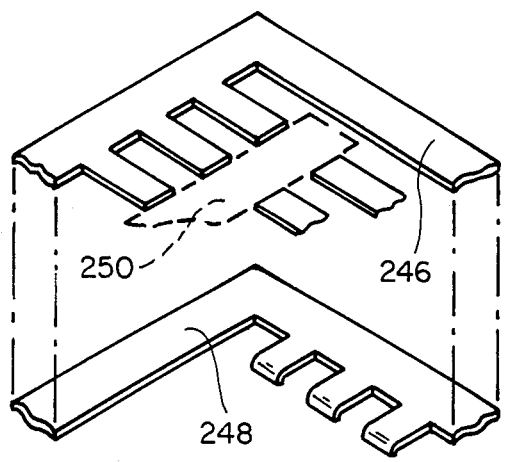
FIG_29
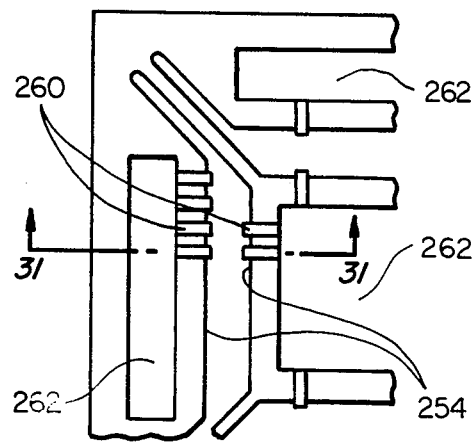
FIG_30
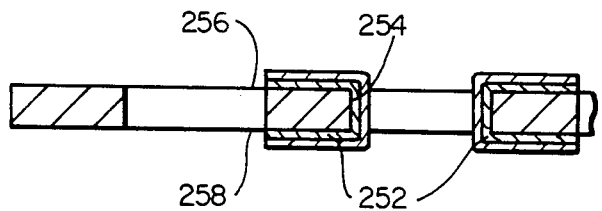
FIG_31

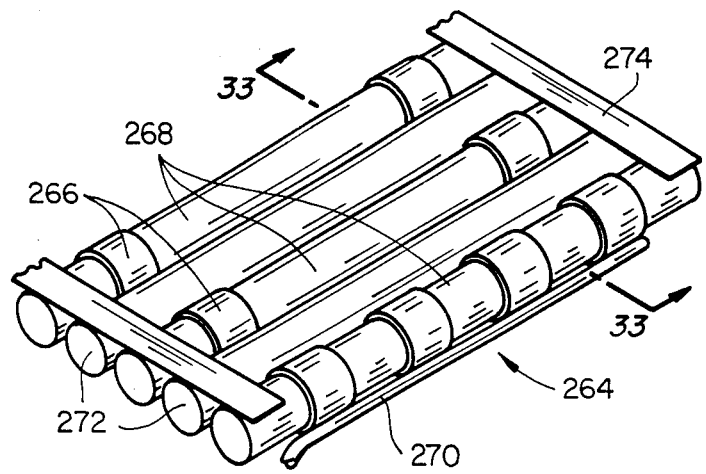
FIG_32
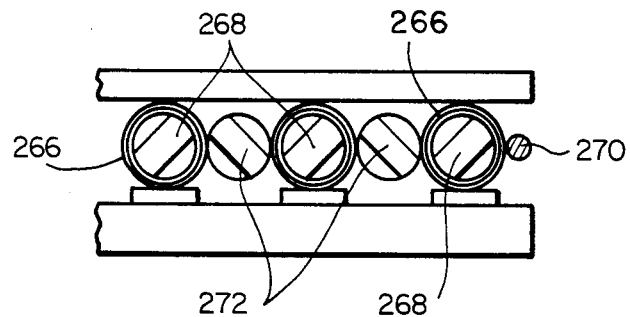
FIG_33
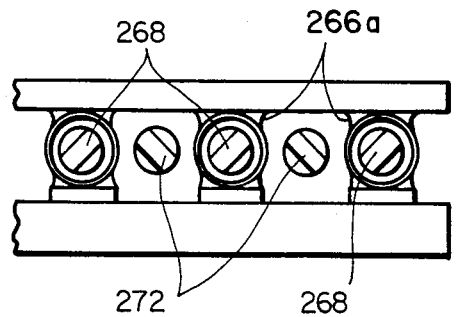
FIG_34

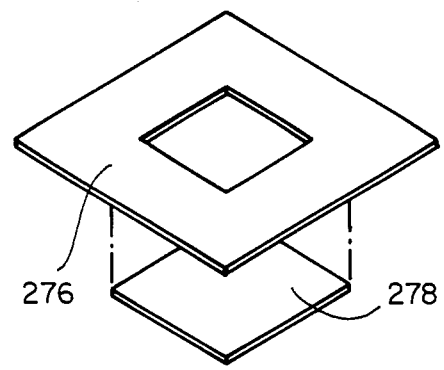
FIG_35A
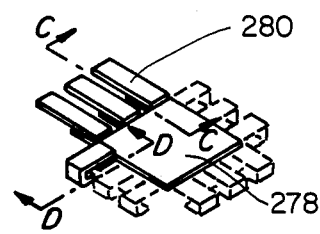
FIG_35B
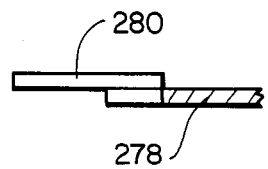
FIG_35C
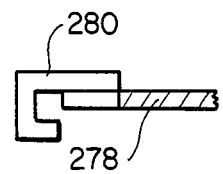
FIG_35D

SOLDER DELIVERY SYSTEMS

BACKGROUND OF THE INVENTION

1. Field of the Invention

The present invention relates to the fabrication of electronic circuit packages and in particular to methods, and mechanical means for attaching electronic components, especially leadless ceramic packages for electronic devices, to each other or to supporting substrates such as circuit boards.

2. Prior Art

The microelectronics industry is steadily moving toward the use of smaller electronic circuit devices giving rise to the need for smaller and smaller connecting devices and mounting means for the circuit devices. Circuit devices, such as integrated circuits of complex nature, are embodied in large chips and chip carrier packages (CCP) which have connection pads on the faces and/or edges of the packages. Chip carrier packages can be produced with leads attached (leaded) or they can be leadless.

Leaded CCP's can be soldered directly onto printed circuit boards or printed wire boards. Leadless CCP's can be soldered onto ceramic boards or installed into connectors. However, with glass/epoxy printed circuit boards or other printed wiring boards (hereinafter substrates) leadless CCP's are usually mounted into connectors which are, in turn, mounted on the substrates because of the effect of different thermal expansion coefficients of the materials involved when subjected to temperature fluctuations. Specifically, the CCP and the substrate exhibit different thermal characteristics leading to in-plane stress and strain therebetween as a result of thermal mismatch. Also, any flexure of the substrate result in out-of-plane stresses. Prior art techniques have used small solder spheres or solder paste to attach packages to substrates. Although such known techniques have been used for such surface mounting, there exists a need for a compliant solder joint to compensate for the large stresses resulting from thermal mismatches between the CCP and the substrate, as well as from board warpage and flexure.

Different solutions have been proposed for the foregoing problems. The proper positioning of a predetermined quantity of solder may be achieved with the use of solder preforms spaced on a carrier template in the locations corresponding to the points where the solder joints are to be formed. Examples of this technique may be found in U.S. Pat. Nos. 3,320,658, issued to Bolda et al; 3,396,894, issued to Ellis; 3,472,365, issued to Tiedema; 3,719,981 issued to Steitz; 3,744,129, issued to Dewey; 4,209,893, issued to Dyce et al; and 4,216,350, issued to Reid.

Although the foregoing techniques provide for the correct placement of a predetermined quantity of solder or other suitable joint-forming material, and with the proper dimensioning of the carrier or template, sufficiently small quantities of solder can be positioned on close spacing between centers, these proposals do not address the problems of high shear strains in the solder joints.

In U.S. Pat. No. 4,412,642 to Fisher, leadless chip carriers are converted to "cast-leaded chip carriers" by molding high melting point leads to the chip carrier. Additional examples of methods and devices for soldering terminals to a printed circuit board are shown in U.S. Pat. No. 3,926,360 to Moister and in the IBM Techical Disclosure Bulletin, Vol. 21, No. 6, dated November 1978.

While the above disclosures have addressed the problem of connections which must be able to withstand the stresses from thermal cycles, none discloses a satisfactory solution which both solves the problem and is suitable for reliable manufacturing processes.

Because of the significant problems associated with the attempt to position preferred material such as a solder and to effect electrical contact, alternative less desirable conductive materials and/or mechanical approaches have been developed. U.S. Pat. No. 4,064,623 to Moore shows an electrical connector utilizing conductive rubber rods. U.S. Pat. No. 4,295,700 to Sado discloses a similar press-contact type interconnector utilizing elastic material having anisotropical electroconductivity. U.S. Pat. No. 3,991,463 to Squitieri et al, discloses a method of forming an interconnector having a row of electrically conductive flexible plastic strips. U.S. Pat. No. 4,027,936 to Nemoto et al discloses a connector having electroconductive rubber terminals. U.S. Pat. No. 4,144,648 to Grovender, discloses a connector utilizing conductive elastomer medium. U.S. Pat. No. 4,402,450 to Abraham et al, discloses contact pads of a device which are adapted for bonding components such as contacts of a circuit assembly thereto.

Unfortunately, none of the above disclosures provide the superior electrical interconnection accomplished by solder. It would therefore be highly desirable to have a solder preform delivery system with a precise placement of a predetermined quantity of material in a preferred geometric preform for the formation of a solder-type connection.

Commonly assigned U.K. patent application GB No. 2,142,568 A to Allen et al, equivalent to U.S. Ser. No. 509,684 filed June 30, 1983, now U.S. Pat. No. 4,664,309 and U.S. Ser. No. 610,077 filed May 14, 1984 the dislosures of which are incorporated herein by reference, discloses a chip carrier mounting device which includes a retaining member having a defined pattern of apertures in which are positioned preforms of joint-forming material such as solder or conductive elastomer. The instant invention is an improvement to that mounting device wherein the problem of solder preform positioning and solder preform configuration are addressed.

SUMMARY OF THE INVENTION

The purpose of the instant invention is to provide substantially mechanical means of delivering solder preforms of post, clip and ring configurations to form structural and electrical connection between electrically conductive elements. To accomplish this purpose there is provided delivery systems for solder preforms arranged generally in rectilinear patterns and oriented so that the ends may join two planar surfaces upon the application of heat.

In a first aspect of the invention there is provided a solder post delivery system comprising:
  a positioning means for positioning solder posts, said positioning means being elongated along a longitudinal axis, said positioning means having a plurality of longitudinally spaced openings therethrough, each of said openings having a top and a bottom generally parallel to said longitudinal axis;
  an elongated and flexible backing means having at least one adhesive surface, said backing means connected to said positioning means by said surface and to solder posts to be positioned through said openings; and a plurality of solder posts positioned by said openings and held therein by said backing means, said positioning means capable of being bent with respect to said longitudinal axis to align said solder posts with respect to electrical components to be interconnected.

In a second aspect of the invention there is provided a solder post delivery system comprising:

a positioning means for positioning solder posts, said positioning means including at least three layers of sheet-like material, each of said layers having a plurality of openings therethrough, the openings in each layer being in general axial alignment with the openings in the other layers, said openings being slightly misaligned; and a plurality of solder posts, one solder post being positioned in each generally aligned opening and being secured therein by a force fit created by said slight misalignment.

In a third aspect of the invention there is provided a solder post delivery system comprising:

a positioning means for positioning solder posts comprising a continuous frame having an inner and outer periphery, said frame capable of being discontinuous, said positioning means having securing portions which are capable of removably securing solder posts thereto when said frame is continuous and which are capable of releasing solder posts that may be secured thereto when said frame is discontinuous; and a plurality of solder posts in contact with said securing portions of said positioning means.

In a fourth aspect of the instant invention there is provided a solder post delivery system comprising:

a positioning means for positioning solder posts, said positioning means having a plurality of openings therethrough; and a plurality of solder posts with one post per opening, said posts comprising solder paste which fills said openings to define individual solder posts.

In a fifth aspect of the invention there is provided a method of fabricating a pre-leaded chip carrier package from a reusable solder post delivery system comprising the steps of:

providing a reusable solder post delivery system defined by a mold having a chip carrier package securing portion on one side thereof and having openings therethrough for solder posts extending from said portion to the other side of said mold;

inserting a chip carrier package in said portion;

inserting solder posts through said openings into contact with said chip carrier package;

clamping said solder posts and chip carrier package with respect to said mold;

reflowing solder in said solder posts to secure said solder posts to said carrier package; and removing said mold.

A sixth aspect of the invention there is provided a solder post delivery system comprising:

a positioning means for positioning solder posts, said positioning means being generally planar and having a plurality of openings therethrough, said positioning means being made from a heat-recoverable polymeric material, said positioning means having a first dimension including a first thickness wherein said openings have a first diameter, said positioning means having a second dimension including a smaller, second thickness wherein said openings have a smaller second diameter; and a plurality of solder posts with one post per opening, said posts secured by a force fit within said openings when said openings are at said second diameter and being released when said openings are at said first diameter, said positioning means capable of going from said second dimension to said first dimension upon application of heat.

In a seventh aspect of the invention there is provided a solder clip delivery system comprising:

a positioning means for positioning solder clips comprising a frame having top and bottom surfaces and an inner and an outer periphery, said inner periphery of said frame having portions having a solderable metal deposited thereon and having solder plated on said metal, to define individual solder clips.

In an eighth aspect of the invention there is provided a solder ring delivery system comprising:

a positioning means for positioning solder rings, said positioning means including a plurality of diametrically heat recoverable rods, said rods being adjacent to each other in general spaced parallel relationships; and a plurality of solder rings positioned about said rods, said rods having surface portions about said rods upon which a solderable metal has been deposited and having solder plated on said metal, said metal and solder defining said solder rings, said rods being diametrically shrinkable upon application of heat and capable of being removed.

In a ninth aspect of the invention there is provided a solder clip delivery system comprising:

a thin insulative centerpiece; and, a plurality of outwardly extending metal projections permanently adhered to the periphery of said centerpiece, said projections capable of being bent into a "C" shape.

DESCRIPTION OF THE DRAWING

FIG. 1 is a perspective view of an embodiment of the solder post delivery system.

FIG. 2 is a perspective view of an alternate embodiment of a solder post delivery system having a chip carrier package positioned thereabove.

FIG. 3 is a perspective view of a delivery system being expanded by a fixture into a generally rectangular shape.

FIG. 4 is a perspective view of a delivery system being transformed from a generally circular cross-section to a generally rectangular cross-section.

FIG. 5 is a partial perspective view of an alternate embodiment of delivery system.

FIG. 6 is a plan and partially schematic view of a process for manufacturing a delivery system.

FIG. 7 is a partial perspective view of an alternate embodiment of a delivery system fabricated by the process illustrated in FIG. 6.

FIG. 8 is a partial perspective view of yet another alternate embodiment of delivery system.

FIG. 9 is a partial perspective view similar to FIG. 8 illustrating an optional feature of a delivery system.

FIG. 10 is a partial perspective view of yet another embodiment of delivery system wherein a chip carrier package is positioned above the system.

FIG. 11 is a partial perspective view of yet another embodiment of delivery system.

FIG. 12 is a partial perspective view of an alternate delivery system comprising a plurality of layers of sheet-like material.

FIG. 13 is a partial cross-sectional view taken along section lines 13—13 in FIG. 12.

FIG. 14 is an enlarged partial perspective view of the embodiment shown in FIGS. 12 and 13 illustrating an optional feature of abuttment means.

FIG. 15 is a partial perspective view of yet another embodiment of delivery means wherein a portion of the system upon being discontinuous is shown in phantom.

FIG. 16 is a perspective view of another delivery system having a positioning means which may be ripped away from the solder post after installation.

FIG. 17 is a perspective view of yet another delivery means having an external, reusable hinged positioning means.

FIG. 18 is a perspective view of still another delivery system having swaged solder preforms in a pre-punched array.

FIG. 19 is a perspective view of yet another delivery system having solder preforms delivered by positioning means comprising remaining attached flash. Die apparatus for forming this embodiment of the delivery system are shown in phantom.

FIG. 20 is a perspective view of yet another delivery system having a filled column array of solder posts. The figure illustrates a process for filling openings to form the solder posts.

FIG. 21 is a partial perspective view of another embodiment of delivery system similar to that illustrated in FIG. 20 created by the simultaneous extrusion of the solder post and holder material.

FIG. 22 is a composite view of a reusable delivery system. 22A illustrates a chip carrier package positioned above the system. FIG. 22B illustrates the bottom side of the system containing the chip carrier package with solder posts being positioned through the system in contact with the chip carrier package. FIG. 22C illustrates the application of temperature and pressure to the system. FIG. 22D illustrates the finished chip carrier package having solder posts installed thereon.

FIG. 23 is a perspective view of an alternate embodiment of delivery system having a positioning means which is made from heat recoverable polymeric material. The positioning means having a first dimension is shown in FIG. 23.

FIG. 24 is a perspective view of the delivery system illustrated in FIG. 23 wherein the positioning means is in its non-heat recovered smaller dimension wherein the solder posts are secured within openings in the positioning means.

FIG. 25 is a perspective view of a solder clip delivery system.

FIG. 26 is a partial cross-sectional view illustrating the formation of an individual solder clip. The configuration of the final clip is shown in phantom line.

FIG. 27 is a partial cross-sectional view similar to FIG. 26 illustrating the positioning of a solder clip with respect to electronic substrates to be interconnected.

FIG. 28 is a partial cross-sectional view similar to FIG. 27 wherein the solder clip has been installed and the positioning means is being removed.

FIG. 29 is an exploded partial perspective view of an alternate embodiment of a solder clip delivery system similar to FIG. 25 wherein the system comprises two layers, the lower layer solder clips shown to be already formed and the top layer positioned for placement on top of the lower layer wherein the clips of the top layer have not yet been formed. The finished clips of the top layer are shown in phantom in the bottom part of the figure.

FIG. 30 is a partial plan view of an alternate solder clip delivery system wherein traces of solderable metal having solder plated thereon are deposited in given arrays on the surfaces of a positioning means.

FIG. 31 is a partial cross-sectional view taken along section lines 31—31 in FIG. 30.

FIG. 32 is a partial perspective view of a solder ring delivery system having heat recoverable rods with plated on solder rings separated by insulative heat recoverable rods. This figure also illustrates an optional plating buss wire which may be peeled off and discarded.

FIG. 33 is a partial cross-sectional view taken along section lines 33—33 in FIG. 32.

FIG. 34 is a partial cross-sectional view similar to FIG. 33 wherein the heat recoverable rods have been recovered to a smaller dimension while the solder rings have electrically interconnected the substrates.

FIG. 35 is a multiple view of an alternate embodiment wherein A shows an exploded view of initial components, B shows a finished product, C and D are enlarged partial cross-sectional views taken along section lines C—C and D—D, respectively.

DESCRIPTION OF THE PREFERRED EMBODIMENTS

With continued reference to the drawing, FIG. 1 illustrates one embodiment of a solder post delivery system having a positioning means 10 for positioning solder posts 12, the positioning means being elongated along a longitudinal axis and having a plurality of longitudinally spaced openings 14 therethrough, each of the openings having a top 16 and a bottom 18 generally parallel to the longitudinal axis. The positioning means is preferably a ribbon of Kapton* tape having windows punched through it.

*KAPTON is a trademark of the EI Dupont du Nemours & Company

The system further comprises an elongated and flexible backing means 20 having at least one adhesive surface 22, the backing means connected to the positioning means by the adhesive surface to secure solder posts 12 through said openings 14. This bandolier construction may be placed in a fixture such as that illustrated in FIG. 2, the chip carrier package set on top and the entire assembly heated to reflow solder.

It can be seen that the above delivery system makes the handling of the small solder posts easier, especially in a high speed production environment wherein a bandolier like system wound on reels lends itself to continuous process manufacturing. After reflow the positioning means and backing means may be stripped off without the need for a chemical wash.

As mentioned above, FIG. 2 illustrates the solder post delivery system of FIG. 1 placed in a fixture 22 and having a chip carrier package 24 positioned with respect thereto such that the connection pads 26 on the edges of the package are in alignment with solder posts 12. It is within the scope of the invention as illustrated in FIG. 2 to have backing means 20 include an additional adhesive surface on the back side thereof to secure the delivery system with respect to the fixture 22. FIG. 2 illustrates such a delivery system wherein the longitudinal ends of the positioning means are closed into a loop which is capable of being pressed outwardly to conform to a geometric configuration and is capable of being retained in the configuration by the additional adhesive surface for the interconnection of the solder posts.

FIG. 3 illustrates yet another fixture having two members 28 and 30 which are movable with respect to each other on the inside of a delivery system. As seen in the figure, the closed loop of the delivery system shown generally at 32 is dropped onto the members 28 and 30 which are expanded and which bend the delivery system from the generally circular cross-section to a generally rectangular cross-section, i.e., a desired cross-section that is complementary to the substrates to be interconnected.

FIG. 4 shows yet another one-piece fixture wherein a loop of the delivery system is capable of being bent from a generally circular cross-section to a generally rectangular cross-section. It can be appreciated that various geometries of delivery systems can be configured with fixtures like those illustrated in FIGS. 2-4 or the like.

FIG. 5 discloses a delivery system similar to that disclosed in FIG. 1 but wherein the positioning means 34 is folded along a line 36 passing generally midway between the tops 38 and the bottoms 40 of the openings 42 providing unobstructed access to the solder posts 44. It is also within the scope of the invention for positioning means 34 to be folded in more than one location along the longitudinal axis. Multiple folds defining a serpentine structure secure the solder posts in a redundant manner. The positioning means 34 may be pulled away from the soldered posts, each fold pulling away from the columns. It is understood that the width of the openings 42 is preferably slightly smaller than the diameter of the solder post 44 so as to create an interference fit to secure the solder post 44 within the openings 42. The delivery system also includes an elongated and flexible backing means 46 as in the earlier described embodiments but wherein the backing means 46 extends beyond at least one longitudinal periphery 48 of the positioning means 34 to provide a surface for securing the positioning means 34. It can be seen that the backing means 46 has an adhesive surface which is exposed through the openings 42 and which extends beyond the periphery 48 of the positioning means to secure the positioning means 34 with respect to a substrate (not shown) to be interconnected.

FIG. 5 also discloses that the positioning means 34 may be cut transversely, as shown generally at 48, to allow the positioning means to be bent with respect to the longitudinal axis of the positioning means.

FIG. 6 discloses in a plan and partially schematic view a continuous method of fabricating a variety of delivery systems including those described earlier. Specifically, there is illustrated a ribbon of tape 50 (preferably Kapton) having windows 52 punched by punch 54 as the tape is moved in the direction generally indicated at 56. Subsequent to the punching operation, a flexible backing means 58 having at least one adhesive surface is applied to the back side of the tape 50 and simultaneously or subsequently solder posts 60 are placed within the openings 52. At a further point, the composite tape is severed by cutting by means shown symbolically at 62. It is understood that it is within the scope of the invention to cut by various means such as laser, heat, blade, etc. The result is the solder post delivery system shown at 64. In the embodiment shown in FIG. 6, the backing means 58 is cut by a separate cutting means 66 which allows the backing means to extend beyond the longitudinal periphery of the positioning means on one side thereof much like the embodiment shown in FIG. 5. It is understood that the width of the positioning means may be varied to extend beyond the tops and bottoms of the solder posts 60 or as shown in FIG. 6 may be generally coincident with the tops and the bottoms of the solder posts 60. It is also within the scope of the invention to use a tape 50 which is slightly heat-recoverable in the transverse direction but not in the longitudinal direction. Heating of the delivery system is accomplished by heating means 68 shown symbolically to be an infrared heat source. The result is that the solder posts as shown at 60' extend beyond the transverse periphery of the positioning means 50' to facilitate engagement with substrates to be interconnected.

FIG. 7 discloses the solder post delivery system embodiment typically fabricated by the process and apparatus shown in FIG. 6. In this embodiment the positioning means 50' positions the solder posts 60' and the flexible backing means 58 having at least one adhesive surface is connected to the positioning means 50' and to the solder posts 60'. The backing means 58 extends beyond at least the one longitudinal periphery of the positioning means as shown to provide a surface for securing the positioning means 50'.

FIG. 8 discloses yet another embodiment wherein the positioning means 70 is folded along lines 72 and 74 coincident with the tops and the bottoms, respectively, of the openings 76 to form a U-shaped cross-section having a top flange 78 and a bottom flange 80 that extend transversely at right angles to the longitudinal axis of the delivery system. This figure also illustrates a cut 82 in the top flange 78, it being understood that a similar cut exists in the bottom flange 80 to allow the positioning means to be bent out of the plane of the positioning means.

FIG. 9 discloses a solder post delivery system substantially identical to that illustrated in FIG. 8 but wherein at least one of the flanges 78' is provided with at least one notch 84, the adhesive surface 86 of the backing means being exposed through the notch 84. In this embodiment an optional cover means 88 may be provided in removable contact with the exposed adhesive surface 86 to protect the surface before installation of the system.

FIG. 10 illustrates yet another embodiment encompassing many of the features illustrated in FIGS. 7-9 but wherein the positioning means 90 is folded along a line 92 coincident with the tops of the openings to form an L-shaped cross-section having a top flange 94 that extends transversely at a general right angle to the longitudinal axis, the backing means 96 conforming to the top flange 94 to provide an adhesive surface capable of securing the positioning means with respect to a substrate. In this embodiment the solder posts 98 are secured against the inside of the delivery system in openings shown in phantom. The view illustrates the back of the backing means, it being understood that the adhesive surface is on the inside of the backing means 96.

FIG. 10 also illustrates a cut 100 which allows the positioning means and corresponding backing means to be bent out of the plane of the positioning means or at at an angle to the longitudinal axis of the delivery system. By longitudinal axis it is understood that in the embodiments shown in FIGS. 1-4 the delivery system and its components comprise a single sheet of material which is readily flexible along the longitudinal axis. However, the embodiments of FIGS. 5-10 disclose delivery systems having bends which add structural integrity along the longitudinal axes and are therefore provided with cuts to allow the positioning means and attached components to be bent out of the plane of the positioning means along the longitudinal axis.

FIG. 10 also illustrates a chip carrier package 102 having connection pads 104 to which the solder posts will become attached during installation of the delivery system. The figure illustrates that the flange 94 may be provided with a window opening, the adhesive surface of the backing means 96 being exposed through the window opening. An optional cover means 106 is in removable contact with the exposed adhesive surface to protect the surface before installation of the system. It is understood that window 105 are the equivalent of the notch 84 as shown in FIG. 9 and is useful in all of the embodiments wherein it is desired to have the positioning means in contact with a substrate and where it is desirable to have the adhesive surface of the backing means available to secure the system with respect to a substrate.

FIG. 11 illustrates yet another embodiment wherein at least two of the openings 108 and 110 (shown in phantom) of the positioning means 112 are empty and the positioning means is folded transversely with respect to said longitudinal axis between the two openings, the adhesive surface of the backing means 114 extending through each of the two openings to contact itself to define a tab and a corner for the positioning means 112 and for the delivery system. As shown in FIG. 11 four openings at each corner are empty and the positioning means is folded midway between the four openings to define a tab having two openings on each side, as can be better seen by viewing openings 116 and 118 (shown in phantom).

It should be appreciated that the use of the empty openings and interfacing of the backing means allows for a less severe bend to be placed in the positioning means 112 on the interior of the delivery system. Specifically, as seen in the figure, the positioning means 112, as noted generally at 120, is bent at an angle of 45° from each interior surface to form a total of a 90° bend in the positioning means. Since the preferred material for the positioning means is a Kapton tape which is relatively stiff, the 45° bend is easier to accomplish than the more severe 90°. It is understood that at the far end 122 of the tab, the positioning means is bent a full 180° back onto itself and may even be fractured. However, the integrity of the tab is maintained by the mating of the adhesive surfaces through the openings as discussed earlier.

FIGS. 12-14 disclose yet another embodiment of the instant invention wherein a solder post delivery system is provided having a positioning means shown generally at 144 for positioning solder posts 146 wherein the positioning means includes at least three layers 148, 150 and 152. Each of the layers are provided with a plurality of openings 154 therethrough, the openings in each layer being in generally axial alignment with the openings in the other layers, the openings being slightly misaligned (See FIG. 13). The plurality of solder posts 146, one solder post being positioned in each generally aligned opening are secured therein by a force-fit created by the slight misalignment of the layers. As seen by the arrows in FIG. 13, the misalignment is created by movement of the layers with respect to each other.

FIG. 14 illustrates that the positioning means 144 may be slit through the several layers and that the layers may be bent slightly out of plane of the layers to define abuttment means 156 for contact and alignment of electrical components such as the one shown in phantom to be interconnected by the system.

FIG. 15 illustrates yet another embodiment of the instant invention wherein the positioning means 124 comprises a continuous frame having an inner periphery 126 and an outer periphery 128. The positioning means 124 is provided with securing portions 130 which are capable of removably securing solder posts 132 thereto when the frame is continuous and which are capable of releasing the solder posts that may be secured thereto when the frame is discontinuous as shown in phantom at 134. The plurality of solder posts 132 in contact with securing portions 130 of the positioning means are secured in the embodiment of FIG. 15 by a force fit with openings in the positioning means 124. Specifically, a frame of FIG. 15 has a generally U-shaped cross-section having top flange 136 and bottom flange 138. In this embodiment the securing portion on the inner periphery of the frame comprises a plurality of spaced openings 130 extending across the width of the inner periphery 126 and into the top and the bottom flanges 136 and 138. Each of the solder posts 132 which can be more clearly seen in the broken portion of the frame are held within one of the openings 130 by contact with the edges of the opening. The figure also illustrates that the frame may be cut as shown generally at 140 so that the frame may be bent at the corners thereof. At one corner 142 of the frame the positioning means and backing means are discontinuous to form a tab which may be separated after installation of the solder post, the positioning means being separable from the solder posts, again as shown in phantom.

The array of solder posts 132 are held in the frame which may be made of any temperature-resistant, non-solderable material. The frame is formed as shown to have enough rigidity along each row to deliver the solder post in a straight line and the frame is made in a semi-continuous strip making it convenient to snap in the solder posts. It is folded at the predetermined points to form the U-shaped cross-section and extensions of the frame at the corner 142 are welded, glued or stapled.

FIG. 16 illustrates another embodiment of the instant invention wherein the positioning means 158 is made of a low-durometer elastomer and includes a plurality of openings 160 therethrough to receive solder posts 162. Each of the openings 160 is connected to the inner periphery of the positioning means 158 by a slit 164, the slits 164 capable of being widened to enlarge the openings 160 to release solder posts secured therein when the frame is made discontinuous such as by tearing the frame at cut 166. The openings 160 and slits 164 form a keyhole-type cut which allows the positioning means to be simply pulled away from the solder posts 162. Typical elastomers that may be utilized are silicone rubber, Viton, polyurethane and nitrile rubber. These types of low-durometer materials are compliant enough that after the solder posts are reflowed at the tops and the bottoms thereof the elastomeric positioning means may be ripped off leaving the pins in place.

FIG. 17 illustrates yet another embodiment of solder post delivery system comprising an external, reusable, hinged frame. Specifically, there is disclosed a positioning means for positioning solder posts having a continuous, generally rectangular frame 168, the frame capable of being discontinuous at 170 upon removal of the pin 172, the positioning means having securing portions 174 which are capable of releasing solder posts 176 that may be secured thereto when the frame is made discontinuous. In this embodiment the inner periphery of the frame 168 is contoured to provide spaced securing portions 174 that are complementary to some portion of the surface of the solder posts to secure the solder post thereto. The frame 168 is provided with corners, one of them being discontinuous at 170 and including the separate removable fastening means in the form of the pin 172 to hold the corner together. The other corners 178 are bendable in a hinge-like fashion to open the frame with respect to the solder posts to release the posts from the securing portions. The solder posts 176 are held in place against the spaced securing portions by the use of a very small amount of glue or adhesive-type material to temporarily hold the solder posts in position.

FIG. 18 illustrates another embodiment of solder post delivery system having a positioning means for positioning solder posts comprising a continuous, generally rectangular frame 180, having an inner and outer periphery, but wherein the frame remains continuous in overall configuration and is made from a dialectric material. In this embodiment it is understood that the frame 180 may be left in place after the reflow of the solder posts 182. The solder posts 182 are preferably a filled solder and the frame 180 is shaped and perforated to fit the individual application. In this embodiment the securing portions comprise openings 184 through the frame, the diameter of the openings 184 being smaller in diameter as noted at 186 than the general diameter of the solder posts where the solder posts are secured within the openings 184. The figure also illustrates an alternate shape of solder post 188 which extends generally from only one side of the frame 180. Each type of solder post is held in place by the offset of post material. The posts are shown to be preferably somewhat tapered to provide support. The dialectric material of the frame 180 may be any suitable dialectric material such as mica or Kapton, etc.

FIG. 19 illustrates a solder post delivery system comprising a positioning means for positioning solder posts comprising a continuous, generally rectangular frame 190 and a plurality of solder posts 192. The frame 190 is preferably continuous across the inner periphery thereof and comprises a thin sheet of solder from which the solder posts 192 extend generally normal thereto. In this embodiment the frame 190 is capable of being discontinuous upon heating the frame or thin sheet of solder since the solder is capable of flowing to supplement the solder posts 192. In this embodiment the securing portion of the positioning means is the integral connection of the solder posts 192 and the sheet 190.

Also illustrated in FIG. 19 is the die 194 shown in phantom illustrating apparatus which is capable of fabricating the solder delivery system. Specifically, it can be seen that a sheet of fuseable material or solder may be placed in the lower part of the die and hit with the upper part of the die resulting in the formed solder posts 192 connected and capable of being delivered by the remaining attached flash forming the thin sheet of solder for positioning means 190. It is understood that that starting sheet of material may include a thin copper mesh or other filler that will give integrity to the construction but which will disappear from the sheet 190 upon heating.

FIG. 20 illustrates yet another embodiment of the instant invention wherein the solder delivery system comprises a positioning means 196 for positioning solder posts, the positioning means having a plurality of openings 198 therethrough and further including a plurality of solder posts with one post per opening, the posts comprising solder paste 200 which fills the openings 198 to define individual solder posts. In this embodiment, the solder paste 200 is extruded into the openings 198 by wiping the solder paste across the surface of the positioning means 196 by wiping means 202.

FIG. 21 illustrates an alternative approach to fabrication of the delivery system wherein the positioning means 204 and the solder paste 206 are co-extruded in one direction to define a continuous composite, the composite being sliced through at an angle perpendicular to the direction of co-extrusion to define an individual solder delivery system shown generally at 208. Solder paste used to fabricate the embodiments of FIGS. 20 and 21 may be made from a solder and spherical and/or angular wettable, conductive, high melting filler particles forming a paste having a percentage of solder filler, resin, flux and other materials as desired. For all of the embodiments of the instant invention suitable joint-forming material in the form of filled solder composition, paste or supported solder which will retain its shape upon the solder melting and reflowing are within the scope of the instant invention. As used herein by the term "filled solder" and solder paste are discussed in the commonly assigned U.K. application Ser. No. GB 2,142,568A, equivalent to U.S. Ser. Nos. 509,684 and 610,077 referred to and incorporated by reference earlier.

FIG. 22 illustrates method and apparatus for fabricating a preleaded chip carrier package 210, the method comprising the steps of providing a reusable solder post delivery system defined by a mold 212, having a chip carrier package securing portion 214 in one side thereof, and having openings 216 therethrough for solder posts extending from a securing portion 214 to the other side of the mold 212, as seen in FIG. 22A; inserting a chip carrier package 218 in the portion 214; inserting solder posts 220 through the openings 216 into contact with the chip carrier package 218 (as can be seen in FIG. 22B wherein the mold 212 has been turned over, as noted by the directional arrow); clamping the solder posts 220 and the chip carrier package with respect to the mold 212 (as can be seen in FIG. 22C) while reflowing the solder posts to secure the solder posts 220 to the carrier package 218; and finally removing the mold to produce the preleaded chip carrier package (as can be seen in FIG. 22D). The above apparatus may be made disposable by using dissolvable material such as water soluble aluminum for mold 212. Aluminum resists being soldered to and is structurally reliable for the intended application.

FIGS. 23 and 24 illustrate another embodiment of a solder post delivery system of an heat-activated mechanically removable positioning means for solder posts. Specifically, there is disclosed a positioning means 222 for positioning solder posts 224, the positioning means being generally planar and having a plurality of openings 226 therethrough, the positioning means being made from a heat-recoverable polymeric material and the positioning means having a first dimension, as seen in FIG. 23, including a first thickness wherein the openings have a first diameter and the positioning means having a second dimension as seen in FIG. 24, including a smaller, second thickness and wherein the openings have a smaller second diameter. The plurality of solder posts 224 with one post per opening are secured by a force fit within the openings when the openings are at the smaller, second diameter. It can be appreciated that when the openings are at the first diameter the solder posts are released, the positioning means being capable of going from the second dimension to the first dimension upon application of heat.

In the embodiment of FIGS. 23 and 24 a flat sheet of radiation cross-linked polymer is punched in the desired pattern and the opening diameter is larger than the column diameter of the solder posts. The positioning means is then pressed while above the melt point to decrease the opening diameter while the opening spacing is maintained. The positioning means is then cooled and the smaller opening dimension is set temporarily. The solder posts are then inserted as seen in FIG. 24. During the heating of the system and the reflow of the solder, the positioning means returns to its original shape and dimension as seen in FIG. 23. It is then possible for the positioning means 222 to be easily removed mechanically. Suitable heat recoverable materials such as polyethylene, Kynar and other materials are well known as well as the cross-linking technology useful to elevate the melting point of the polymeric materials above that of the fusible solder posts.

FIG. 25 illustrates an embodiment of the instant invention in the form of a solder clip delivery system. In this embodiment a sheet of flexible, non-solderable material, such as plastic, is prepared to have flat, thin traces of solderable metal such as copper deposited in given arrays on one surface. Solder is then placed on the metal. The assembly is formed to bend the metal into a shape so that the solder coated surface faces outward so that portions of the surface are parallel with each other. This assembly is placed between a chip carrier package having matching solderable pads and a corresponding substrate having like pads. The application of heat flows the solder, causing the permanent joint to be made between the chip carrier pads and the substrate. The act of heating preferably loosens the bond between the material under the metal and this material may be pulled out and removed, if desired, increasing the durability of the joints and allowing them to flex more freely. A similar structure may be fabricated by adhering a thin metal layer over an insulated centerpiece and subsequently trimming the metal layer and center piece at the edges thereof to create outwardly extending conductive items which become clips. This structure will be discussed later with respect to FIG. 35.

FIG. 25 is a perspective view of a complete device shown generally at 228 wherein 230 is the positioning means for positioning the solder clips and comprises a generally rectangular frame having top surface 232 and bottom surface 234 and having an inner and outer periphery, the inner periphery of the frame having portions having a solderable metal deposited thereon and having solder plated on the metal to define individual solder clips 236. The rectangular frame may be cut as noted in phantom at 237 to remove the frame as will become apparent from the following.

FIG. 26 is a partial cross-sectional view of a solder clip 236 shown in phantom. The figure illustrates how the clip is formed wherein the positioning means 234 referred to as the frame has had solderable metal 238 deposited thereon and has solder 240 plated on the metal to define the individual solder clip.

FIG. 27 shows a cross-section similar to FIG. 26 wherein a chip carrier package 242 is positioned above the solder clip delivery system 228 which is, in turn, positioned above the substrate pads 244.

FIG. 28 illustrates the parts in position after the application of heat wherein the solder 240 flows and joins the metal 238 to the chip carrier 242 and the substrate pads 244. As mentioned earlier, the delivery material referred to as the positioning means 234 may be pulled away from the metal strips and discarded. Thus, it can be seen that the frame 34 is capable of being detached from the clips when heat is applied to the clips, the heat melting the solder to cause a permanent joint between the metal and the component to be connected in loosening the frame from metal. It likewise can be seen that the inner periphery of the frame, having the portions of solderable metal deposited thereon project inwardly and are fingerlike portions having the metal deposited on the top surface thereof, the portions being bent out of the plane of the surface to form a generally C-shaped solder clip.

FIG. 29 illustrates a method of fabrication wherein the frame is defined by two parallel layers 246 and 248, each layer having portions projecting from only two opposite sides thereof and the layers being oriented at right angles to each other so that the portions project inwardly from all sides of the frame when the layers are brought together. In other words, the two opposed rows of termination strips are combined at 90° angles to each other and once formed into the preferred C-shapes will have pads closely adjoining in the corners. Item 250, in FIG. 29, and item 252, in FIG. 25, are optional plating busses for the attachment of a current source to improve metal deposition as is known to one skilled in the art. Such an optional plating buss is removed after plating is accomplished. A conductive polymer may be used instead of a plating buss 250 in FIG. 29, 252 in FIG. 25 and yet to be described 262 in FIG. 30. The conductive polymer frame members provide an integral current return path for the electro deposition of the metals to make the clips.

FIGS. 30 and 31 illustrate a variation in the solder clip delivery system described above wherein the solderable metal 252, as seen in the cross-sectional view of FIG. 31, taken along section lines 31—31 of FIG. 30, is deposited along the inner periphery 254 and the top surface 256 and the bottom surface 258 in a spaced-apart fashion, as seen in FIG. 30, to define C-shaped configurations upon which the solder is plated to define individual solder clips 260. In FIG. 30, areas 262 are plating busses which may be punched out prior to the use of the device. In the embodiments of FIGS. 30 and 31 everything is similar in arrangement in function to the formed clips described with respect to FIGS. 25-29, except that the solder clad opposed C-shaped solder clips are fabricated around the edge of positioning means, the opposed sides and adjoining edges are sensitized by chemical and other well known processes to form a site for metal deposition. Doing so in a direct way allows for much finer features to be created and it also permits the features to be formed closer together. FIG. 30 also illustrates how nested rows of solder clips may be fabricated.

FIGS. 32-34 illustrate yet another chip carrier joining device using solder-clad deposited metal over an insulative supporting structure, several of which may be arranged to form an array. In this embodiment, the supporting structure may be removed by heat recovery from the supporting structure or by chemical means. Removal of the supporting means facilitates inspection and improved flexibility of the joints. Specifically, there is disclosed a solder ring delivery system shown generally at 264, comprising a positioning means for positioning solder rings 266, the positioning means including a plurality of diametrically heat-recoverable rods 268, the rods being adjacent to each other in spaced parallel relationships. It is also within the scope of the invention to use tubes and it is understood that the term "rod" as used herein includes tubing. The delivery system includes a plurality of solder rings 266 positioned about the rod, the rods having surface portions about the rods, upon which a solderable metal has been deposited and having solder plated on the metal, the metal and the solder defining the individual solder rings 266. The rods 268 are preferably diametrically shrinkable upon application of heat and are therefore capable of being removed.

The heat-shrinkable tube or rod may be plated or clad with rings of similar coated metal. The rod may also be chemically dissolvable. In either case, the rod or tube is used to position the rings in place between the chip carrier pads and the substrate pads. After application of heat to join the pads together by means of soldering, as seen in FIG. 34, the rods are removed. Absence of the rods again permits joint inspection. Absence of the supporting rod also permits the rings to flex more freely, increasing the durability of the joints during heat cycling and mechanical flexing.

If a tube is used, it may be conventional heat-shrinkable material which contracts radially during application of heat. If a rod is used, it may be foamed so that upon heating it collapses to a smaller diameter. If the rod is chemically removed, it is fabricated from a material which permits chemical fabrication of the solder-clad rings.

The ringed rods can be fabricated in a continuous process. The rod is photochemically (or the like) sensitized to receive an electrolytic deposit of metal. A plating buss wire 270 is pressed into contact with the sensitized areas. Electrical plating then builds the required metal thickness. Tin or other suitable solderable metals are added in turn. The plated buss wire is peeled off and discarded. The electroplated tin and lead may be reflowed by select infrared or radio-frequency methods so as not to shrink the rod. Conductive polymer may be used instead of conventional material for the rod or tube to perform two functions. In the first instance it may eliminate the need for a buss wire 270 or the like during plating. In the second instance, it may become hot enough to recover (shrink) if sufficient current is applied.

Alternate ringed rods 268 and unringed rods or insulators 272 are grouped together in arrays to match given pad-to-pad geometries. The group may be held together with tape 274 or the like. After heating the tape 274 may be used to remove all of the rods at once.

FIG. 32 illustrates ring rods 268, separated by unringed rods 272. FIG. 33 illustrates the same relationship for application of heat. FIG. 34 illustrates the array after application of heat and after the solder-cladding 266a has joined opposing pads. The rods 268 and 272 have been reduced in diameter because of their plastic memory.

FIG. 35A referred to earlier shows a thin metal frame 276 having a square hole therethrough so as to overlap a thin, insulative (non-metal, non-conductive, semi-rigid) center piece 278. The two items are then adhered together permanently to form a laminated structure.

Portions of fram 276 and center piece 278 are cut away to produce a plurality of outwardly extending metal projections 280 as seen in FIG. 35B and may be further bent into a "C" shape to interface and to be soldered to conductive pads of a device to be connected (not shown). Partial cross-sectional view FIG. 35C, taken along section lines C—C, illustrates the item 280. Partial cross-sectional view FIG. 35D, taken along section lines D—D, illustrates the finished "C" shape.

While preferred embodiments of the invention have been illustrated and described, it will be appreciated that variations therefrom may be made without departing from the scope of the invention as defined in the appended claims.

What is claimed is:

1. A solder post delivery system comprising:
   a positioning means for positioning solder posts, said positioning means being elongated along a longitudinal axis, said positioning means having a plurality of longitudinally spaced openings therethrough, each of said openings having a top and a bottom generally parallel to said longitudinal axis wherein said positioning means is folded along a line generally parallel to the tops and bottoms of said openings providing unobstructed access to said solder posts;
   an elongated and flexible backing means having at least one adhesive surface, said backing means connected to said positioning means by said surface and to solder posts to be positioned through said openings; and
   a plurality of solder posts positioned by said openings and held therein by said backing means, said positioning means capable of being bent with respect to said longitudinal axis to align the ends of said solder posts with respect to electrical components to be interconnected.

2. A delivery system as in claim 1 wherein longitudinal ends of said positioning means are closed into a loop which is capable of being curved outwardly to conform to a geometric configuration and is capable of being retained in said configuration for interconnection of said solder posts.

3. A delivery system as in claim 2 wherein said loop is capable of being bent from a generally circular cross-section to a generally rectangular cross-section.

4. A delivery system as in claim 1 wherein said backing means includes an adhesive surface on both sides thereof, said positioning means capable of being placed against external support and being retained in position by said backing means.

5. A delivery system in claim 1 wherein said positioning means is folded along a line passing generally midway between the tops and bottoms of said openings providing unobstructed access to said solder posts, said backing means extending beyond at least one longitudinal periphery of said positioning means to provide a surface for securing said positioning means.

6. A delivery system as in claim 1 wherein said positioning means is folded along lines coincident with the tops and bottoms, respectively, of said openings to form a U-shaped cross-section having top and bottom flanges that extend transversely at right angles to said longitudinal axis.

7. A delivery system as in claim 6 wherein at least one of said flanges is provided with at least one notch, said adhesive surface of said backing means being exposed through said notch.

8. A delivery system as in claim 7 further including cover means in removable contact with said exposed adhesive surface to protect said surface before installation of said system.

9. A delivery system as in claim 6 wherein said flanges are cut transversely to allow said positioning means to be bent.

10. A delivery system as in claim 1 wherein said positioning means is folded along a line coincident with tops of said openings to form an L-shaped cross-section having a top flange that extends transversely at a right angle to said longitudinal axis, said backing means conforming to said top flange to provide an adhesive surface capable of securing said positioning means with respect to a substrate.

11. A delivery system as in claim 10 wherein said flange is cut transversely to allow said positioning means to be bent.

12. A delivery system as in claim 10 wherein said flange includes at least one window opening therethrough, said adhesive surface being exposed through said window opening.

13. A delivery system as in claim 12 further including cover means in removable contact with said exposed adhesive surface to protect said surface before installation of the system.

14. A delivery system as in claim 1 wherein at least two of said openings are empty and said positioning means is folded transversely with respect to said longitudinal axis between said two openings, said adhesive surface of said backing means extending through each of said two openings to contact itself to define a tab and a corner for said positioning means.

15. A solder post delivery system comprising:
a positioning means for positioning solder posts, said positioning means including at least three layers of sheet-like material, each of said layers having a plurality of openings therethrough, the openings in each layer being in general axial alignment with the openings in the other layers, said openings being capable of being slightly misaligned by movement of the layers with respect to each other; and
a plurality of solder posts, one solder post being positioned in each generally aligned opening and being secured therein by a force fit created by said slight misalignment.

16. A system as in claim 15 wherein said positioning means is slit through said layers and said layers are bent slightly out of the plane of said layers to define abutment means for contact and alignment of electrical components to be interconnected by the system.

17. A solder post delivery system comprising:
a positioning means for positioning solder posts comprising a continuous frame having an inner and outer periphery, said frame capable of being discontinuous, said positioning means having securing portions which are capable of removably securing solder posts thereto when said frame is continuous and which are capable of releasing solder posts that may be secured thereto when said frame is discontinuous; and a plurality of solder posts in contact with said securing portions of said positioning means; and
wherein said frame has a generally U-shaped cross-section having top and bottom flanges and a securing portion on the inner periphery of said frame comprising a plurality of spaced openings, each of said openings extending across the width of said inner periphery and into said top and bottom flange, each of said solder posts being positioned and held within one of said openings by contact with the edges of each of said openings.

18. A solder post delivery system comprising:
a positioning means for positioning solder posts comprising a continuous frame having an inner and outer periphery, said frame capable of being discontinuous, said positioning means having securing portions which are capable of removably securing solder posts thereto when said frame is continuous and which are capable of releasing solder posts that may be secured thereto when said frame is discontinuous; and
a plurality of solder posts in contact with said securing portions of said positioning means; and
wherein the inner periphery of said frame is contoured to provide spaced securing portions thereof that are complementary to said solder posts to secure said solder posts thereto, said frame having corners, said frame being discontinuous at one of said corners of said frame including separate removable fastening means to hold said corner together, said other cameras being bendable in hinge-like fashion to open said frame with respect to said solder posts to release said solder posts from said securing portions.

19. A solider delivery system comprising:
a positioning means for positioning solder posts, said positioning means having a plurality of openings therethrough; and
a plurality of solder posts with one post per opening, said posts comprising solder paste which fills said openings to define individual solder posts; and
wherein said positioning means and said solder paste are co-extruded in one direction to define a continuous composite, said composite being sliced through at an angle perpendicular to the direction of co-extrusion to define an individual solder delivery system.

20. A solder post delivery system comprising:
a positioning means for positioning solder posts, said positioning means being generally planar and having a plurality of openings therethrough, said positioning means being made from a heat-recoverable polymeric material, said positioning means having a first dimension including a first thickness wherein said openings have a first diameter, said positioning means having a second dimension including a smaller, second thickness wherein said openings have a smaller second diameter; and
a plurality of solder posts with one post per opening, said posts secured by a force fit within said openings when said openings are at said second diameter and being released when said openings are at said first diameter, said positioning means capable of going from said second dimension to said first dimension upon application of heat.

21. A solder clip delivery system comprising:
a positioning means for positioning solder clips comprising a frame having top and bottom surfaces and an inner and an outer periphery, said inner periphery of said frame having portions having a solderable metal deposited thereon and having solder plated on said metal, to define individual solder clips; and wherein said frame is capable of being detached from said clips when heat is applied to said clips, heat melting said solder to cause a permanent joint between the metal and the component to be connected and loosening the frame from said metal.

22. A solder clip delivery system comprising:

a positioning means for positioning solder clips comprising a frame having top and bottom surfaces and an inner and an outer periphery, said inner periphery of said frame having portions having a solderable metal deposited thereon and having solder plated on said metal, to define individual solder clips; and wherein said portions are inwardly projecting finger-like portions having metal deposited on the top surface thereof, said portions being bent out of the plane of said surface to form a generally C-shaped solder clip.

23. A delivery system as in claim 22 wherein said frame is defined by two parallel layers, each layer having portions projecting from only two opposed sides thereof, said layers being oriented at right angles to each other so that portions project inwardly from all sides of the frame.

24. A solder ring delivery system comprising:

a positioning means for positioning solder rings, said positioning means including a plurality of diametrically heat-recoverable rods, said rods being adjacent to each other in general spaced parallel relationship; and a plurality of solder rings positioned about said rods, said rods having surface portions about said rods upon which a solderable metal has been deposited and having solder plated on said metal, said metal and solder defining said solder rings, said rods being diametrically shrinkable upon application of heat and capable of being removed.

* * * * *